United States Patent
Zhang et al.

(10) Patent No.: US 10,886,369 B2
(45) Date of Patent: Jan. 5, 2021

(54) FORMATION OF SELF-LIMITED INNER SPACER FOR GATE-ALL-AROUND NANOSHEET FET

(71) Applicant: International Business Machines Corporation, Armonk, NY (US)

(72) Inventors: Jingyun Zhang, Albany, NY (US); Takashi Ando, Eastchester, NY (US); Choonghyun Lee, Rensselaer, NY (US); Alexander Reznicek, Troy, NY (US); Pouya Hashemi, Purchase, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/561,983

(22) Filed: Sep. 5, 2019

(65) Prior Publication Data
US 2019/0393306 A1 Dec. 26, 2019

Related U.S. Application Data

(62) Division of application No. 15/834,380, filed on Dec. 7, 2017, now Pat. No. 10,553,679.

(51) Int. Cl.
| | |
|---|---|
| *H01L 29/06* | (2006.01) |
| *H01L 29/66* | (2006.01) |
| *H01L 29/786* | (2006.01) |
| *H01L 29/45* | (2006.01) |
| *H01L 29/417* | (2006.01) |

(Continued)

(52) U.S. Cl.
CPC .... *H01L 29/0673* (2013.01); *H01L 21/02112* (2013.01); *H01L 21/02532* (2013.01); *H01L 21/2236* (2013.01); *H01L 21/30604* (2013.01); *H01L 21/324* (2013.01); *H01L 21/32115* (2013.01); *H01L 29/41733* (2013.01); *H01L 29/42392* (2013.01); *H01L 29/45* (2013.01); *H01L 29/66439* (2013.01); *H01L 29/66545* (2013.01); *H01L 29/66553* (2013.01); *H01L 29/66742* (2013.01); *H01L 29/775* (2013.01); *H01L 29/78618* (2013.01); *H01L 29/78621* (2013.01); *H01L 29/78684* (2013.01)

(58) Field of Classification Search
CPC combination set(s) only.
See application file for complete search history.

(56) References Cited

U.S. PATENT DOCUMENTS

| | | | |
|---|---|---|---|
| 7,112,832 B2 * | 9/2006 | Orlowski | H01L 29/42384 257/241 |
| 7,374,986 B2 | 5/2008 | Kim et al. | |

(Continued)

OTHER PUBLICATIONS

Notice Allowance dated Sep. 27, 2019 received in the parent U.S. Patent Application, namely U.S. Appl. No. 15/834,380, Copy Not Enclosed.

(Continued)

*Primary Examiner* — Telly D Green
(74) *Attorney, Agent, or Firm* — Scully, Scott, Murphy & Presser, P.C.; L. Jeffrey Kelly, Esq.

(57) ABSTRACT

A semiconductor structure containing a gate-all-around nanosheet field effect transistor having a self-limited inner spacer composed of a rare earth doped germanium dioxide that provides source/drain isolation between rare earth metal silicide ohmic contacts is provided.

18 Claims, 8 Drawing Sheets

(51) Int. Cl.
*H01L 21/02* (2006.01)
*H01L 21/306* (2006.01)
*H01L 21/324* (2006.01)
*H01L 21/223* (2006.01)
*H01L 21/321* (2006.01)
*H01L 29/775* (2006.01)
*H01L 29/423* (2006.01)

(56) References Cited

U.S. PATENT DOCUMENTS

| | | | | |
|---|---|---|---|---|
| 7,973,336 | B2* | 7/2011 | Savage | H01L 21/6835 257/190 |
| 8,293,608 | B2* | 10/2012 | Orlowski | H01L 29/42392 257/183 |
| 8,816,326 | B2* | 8/2014 | Yin | H01L 29/7391 257/24 |
| 9,647,098 | B2* | 5/2017 | Obradovic | H01L 29/7391 |
| 9,853,132 | B2* | 12/2017 | Cheng | H01L 29/66742 |
| 9,947,767 | B1* | 4/2018 | Chao | H01L 29/66545 |
| 10,134,840 | B2 | 11/2018 | Yeh et al. | |
| 2008/0135949 | A1 | 6/2008 | Lo et al. | |
| 2015/0187660 | A1 | 7/2015 | Patzer et al. | |
| 2015/0270340 | A1 | 9/2015 | Frank et al. | |
| 2016/0020305 | A1 | 1/2016 | Obradovic et al. | |
| 2016/0027870 | A1 | 1/2016 | Cheng et al. | |
| 2016/0365440 | A1 | 12/2016 | Suk et al. | |
| 2017/0170023 | A1 | 6/2017 | Chung et al. | |
| 2018/0226490 | A1 | 8/2018 | Le et al. | |
| 2018/0294331 | A1 | 10/2018 | Cho et al. | |

OTHER PUBLICATIONS

Lee et al., "Oxygen Potential Engineering of Interfacial Layer for Deep Sub-nm EOT High-k Gate Stacks on Ge", Electron Devices Meeting (IEDM), 2013 IEEE International, Date of Conference: Dec. 9-11, 2013, 4 pages, Conference Location: Washington, DC, USA.

List of IBM Patents or Patent Applications Treated As Related, dated Sep. 5, 2019, 2 pages.

* cited by examiner

US 10,886,369 B2

FORMATION OF SELF-LIMITED INNER SPACER FOR GATE-ALL-AROUND NANOSHEET FET

BACKGROUND

The present application relates to a semiconductor structure and a method of forming the same. More particularly, the present application relates to a semiconductor structure containing a gate-all-around nanosheet field effect transistor having a self-limited inner spacer that provides source/drain isolation. The present application also provides a method of forming such a structure.

As semiconductor integrated circuits (ICs) or chips become smaller, vertically stacked semiconductor nanosheets, which are two-dimensional nanostructures in which the vertical thickness is substantially less than the width, are increasingly being used. Semiconductor nanosheets are seen as a feasible device option for 7 nm and beyond scaling of semiconductor devices. Vertically stacked semiconductor nanosheets provide area efficiency and can provide increased drive current within a given layout.

The general process flow for semiconductor nanosheet formation involves the formation of a material stack that contains alternating sacrificial semiconductor material nanosheets and semiconductor channel material nanosheets. After removing the sacrificial semiconductor material nanosheets, vertically stacked and suspended semiconductor channel material nanosheets are provided. A functional gate structure can be formed above and below each semiconductor channel material nanosheet to provide a gate-all-around design.

In the formation of semiconductor nanosheet containing devices, there is a need for providing an inner spacer for disconnecting the sacrificial layers from the epitaxy that forms the source/drain (S/D) semiconductor material structures. As scaling continues it is becoming more difficult to form inner spacers without pinch-off of the gate spacer to the gate spacer region.

SUMMARY

A semiconductor structure containing a gate-all-around nanosheet field effect transistor (FET) having a self-limited inner spacer composed of a rare earth doped germanium dioxide that provides source/drain isolation between rare earth metal silicide ohmic contacts is provided. The semiconductor structure of the present has improved device performance.

One aspect of the present application relates to a semiconductor structure. In one embodiment, the semiconductor structure may include a plurality of vertically stacked and spaced apart silicon germanium alloy channel material nanosheets suspended above a semiconductor substrate. A source/drain (S/D) extension region is located at opposing ends of each silicon germanium alloy channel material nanosheet. Each source/drain (S/D) extension region comprises an n-doped or p-doped silicon germanium alloy. A functional gate structure surrounds a portion of each silicon germanium alloy channel material nanosheet of the plurality of vertically stacked and spaced apart silicon germanium alloy channel material nanosheets. A rare earth metal silicide ohmic contact is located on at least a sidewall surface of each of the source/drain (S/D) extension regions. An inner spacer is located between each of the silicon germanium alloy channel material nanosheets and physically contacting sidewalls of the functional gate structure, wherein the inner spacer comprises a rare earth metal doped germanium dioxide.

Another aspect of the present application relates to a method of forming a semiconductor structure. In one embodiment, the method may include forming at least one nanosheet stack located on a surface of a semiconductor substrate, wherein the at least one nanosheet stack contains alternating nanosheets of a sacrificial silicon nanosheet and a silicon germanium alloy channel material nanosheet, wherein a sacrificial gate structure and a gate spacer are present straddling over a portion of the least one nanosheet stack. Next, each sacrificial silicon nanosheet is recessed to provide recessed sacrificial silicon nanosheets. Source/drain (S/D) extension regions are then formed in the ends of each silicon germanium alloy channel material nanosheet. Next, a rare earth metal doped germanium dioxide layer is formed on physically exposed surfaces of each recessed sacrificial silicon nanosheet and each source/drain (S/D) extension region. An anneal is then performed to convert the rare earth metal doped germanium dioxide layer that is in physical contact with each source/drain (S/D) extension region into a rare earth metal silicide ohmic contact, while the rare earth metal doped germanium dioxide layer that is not in physical contact with each of the source/drain (S/D) extension regions forms an inner spacer. A metal-containing contact structure is then formed laterally adjacent the at least one nanosheet stack and in contact with outermost sidewall surfaces of the inner spacer and the rare earth metal silicide ohmic contact. Next, the sacrificial gate structure and each recessed sacrificial silicon nanosheet are removed to suspend each silicon germanium alloy channel materiel nanosheet, and thereafter a functional gate structure is formed surrounding each suspended silicon germanium alloy channel material nanosheet.

DETAILED DESCRIPTION

Figure 1:
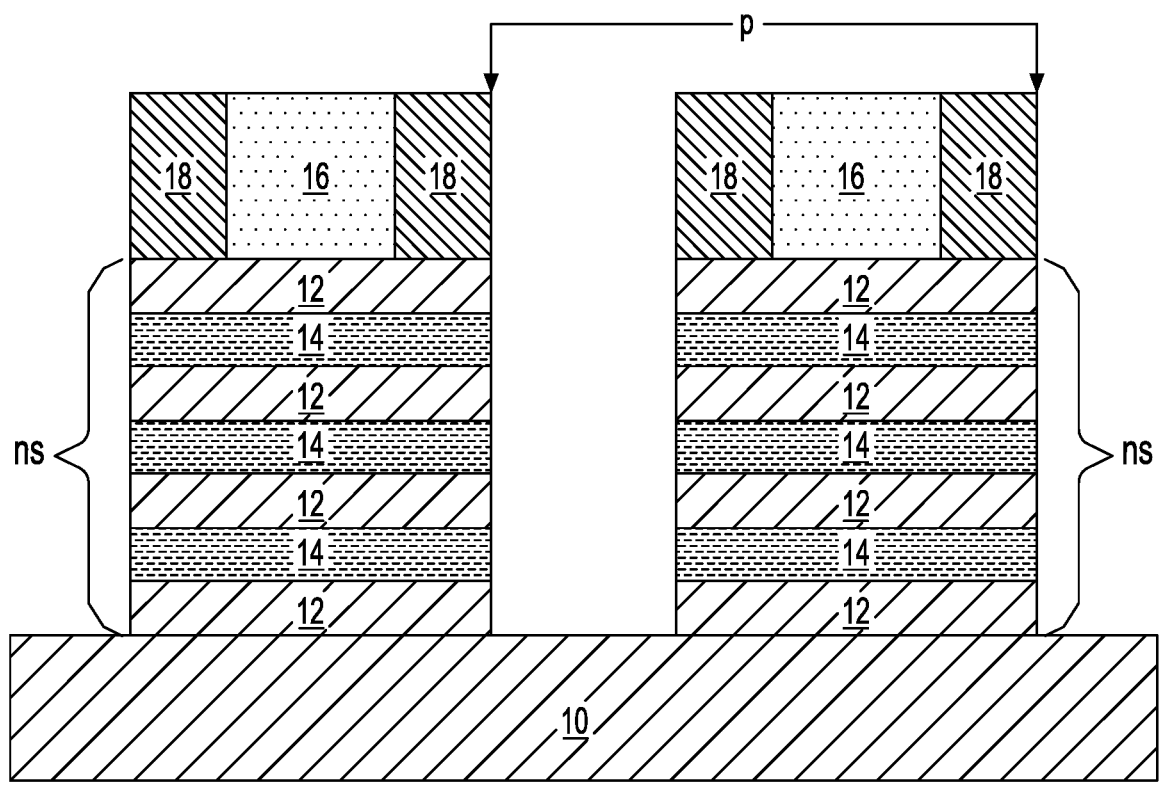
FIG. 1 is a cross sectional view of an exemplary semiconductor structure that can be employed in the present application and including a plurality of nanosheet stacks containing alternating nanosheets of a sacrificial silicon nanosheet and a silicon germanium alloy channel material nanosheet located on a surface of a semiconductor substrate, wherein a sacrificial gate structure and a gate spacer are present straddling over each nanosheet stack.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure that can be employed in the present application. The exemplary structure of FIG. 1 includes a plurality of nanosheet stacks, ns, containing alternating nanosheets of a sacrificial silicon nanosheet 12 and a silicon germanium alloy channel material nanosheet 14 located on a surface of a semiconductor substrate 10; no other materials are present in the nanosheet stacks thus the nanosheet stacks, ns, may be said to consist of alternating nanosheets of a sacrificial silicon nanosheet 12 and a silicon germanium alloy channel material nanosheet 14. Although the present application describes and illustrates a plurality of nanosheet stacks, ns, the present application can be employed when only a single nanosheet stack, ns, is present.

In the present application, each silicon germanium alloy channel material nanosheet 14 is located between a bottom and a top sacrificial silicon nanosheet 12. Thus, each nanosheet stack, ns, contains n number of silicon germanium alloy channel material nanosheets 14, and n+1 number of sacrificial silicon nanosheets 12, wherein n is an integer starting from 1. In the present application, each nanosheet stack, ns, is spaced apart from each nearest neighboring nanosheet stack, ns, by a gap. Also, the pitch (p), as measured from one sidewall surface of one nanosheet stack to the same sidewall surface of the nearest neighboring nanosheet stack is from 40 nm to 100 nm. Pitches greater than 100 nm are also possible.

The exemplary structure shown in FIG. 1 also includes a sacrificial gate structure 16 and a gate spacer 18. The sacrificial gate structure 16 and the gate spacer 18 straddle over different portions of one of the nanosheet stacks, ns. By "straddling" it is meant that a first portion of a first material is located on one side of a second material, and another portion of the first material is located on another side of the second material, and wherein yet a further portion of the first material is present above a topmost surface of the second material. So not to obscure the present application, the drawings only show the sacrificial gate structure 16 and the gate spacer 18 on a topmost surface of each nanosheet stack.

The exemplary semiconductor structure shown in FIG. 1 may be formed by providing a semiconductor substrate 10. In one embodiment, semiconductor substrate 10 is a bulk semiconductor substrate. By "bulk" it is meant that the semiconductor substrate 10 is entirely composed of at least one semiconductor material having semiconducting properties. Examples of semiconductor materials that may provide the semiconductor substrate 10 include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one example, the semiconductor substrate 10 may be entirely composed of silicon. In some embodiments, the semiconductor substrate 10 may include a multilayered semiconductor material stack including at least two different semiconductor materials, as defined above. In one example, the multilayered semiconductor material stack may comprise, in any order, a stack of Si and a silicon germanium alloy.

The semiconductor material that provides the bulk semiconductor substrate 10 may be a single crystalline semiconductor material. The semiconductor material that provides the bulk semiconductor substrate 10 may have any of the well known crystal orientations. For example, the crystal orientation of the semiconductor substrate 10 may be {100}, {110}, or {111}. Other crystallographic orientations besides those specifically mentioned can also be used in the present application.

In some embodiments, the semiconductor substrate 10 is a semiconductor-on-insulator substrate which includes, from top to bottom, a top semiconductor material layer, an insulator layer such as silicon dioxide, and a handle substrate.

After providing the semiconductor substrate 10 and in some embodiments particularly for instances in which the upper portion of the semiconductor substrate 10 is not composed of silicon, a material stack of alternating layers of a sacrificial silicon layer and a silicon germanium alloy channel material layer are formed such that each silicon germanium alloy channel material layer is located between a bottom sacrificial silicon layer and a top sacrificial silicon layer. The material stack can be formed by epitaxial growth (or deposition) of alternating layers of sacrificial silicon and silicon germanium alloy channel material upon semiconductor substrate 10. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. In this embodiment of the present application, each layer that is in present in the material stack has an epitaxial relationship with the semiconductor substrate 10.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The epitaxial growth may be performed at a temperature of from 300° C. to 800° C. The epitaxial growth of the sacrificial silicon layers and the silicon germanium alloy channel material layers can be performed utilizing any well known precursor gas or gas mixture. Carrier gases like hydrogen, nitrogen, helium and argon can be used.

In one embodiment of the present application, each silicon germanium alloy channel material layer that is formed can have a germanium content of from 10 atomic percent germanium to 80 atomic percent germanium, also each sacrificial silicon layer is composed of unalloyed silicon. The silicon germanium alloy channel material layers are used in providing the silicon germanium alloy channel material nanosheets of FIG. 1.

In some embodiments in which the semiconductor substrate 10 includes at least an upper portion that is composed of silicon, a material stack of alternating layers of a silicon germanium alloy channel material layer, as defined above, and a sacrificial silicon layer, as defined above, are formed such that each silicon germanium alloy channel material layer is located between a bottom silicon layer and a top silicon layer. Such a material stack can be formed by epitaxial growth (or deposition) of the alternating layers of a silicon germanium alloy channel material and sacrificial silicon upon the silicon upper portion of the semiconductor substrate 10. In this embodiment, the silicon upper portion of the semiconductor substrate 10 will be processed into the bottommost sacrificial silicon nanosheet of a particularly nanosheet stack.

The material stack and optionally the upper portion of the semiconductor substrate 10 can then be patterned by lithography and etching, or by any other patterning process that can provide at least one fin stack such as, for example, a sidewall image transfer process or a direct self assembly process. Each fin stack includes alternating layers of sacrificial silicon layers and silicon germanium alloy channel material layers, as defined above.

Next, the sacrificial gate structure 16 and the gate spacer 18 are formed straddling over a portion of each fin stack. The sacrificial gate structure 16 may include a single sacrificial material layer or a stack of two or more sacrificial materials (i.e., at least one sacrificial material portion). In one embodiment (not shown), the at least one sacrificial material portion comprises, from bottom to top, a sacrificial gate dielectric portion, a sacrificial gate portion and a sacrificial dielectric cap portion. In some embodiments, the sacrificial gate dielectric portion and/or the sacrificial dielectric cap portion can be omitted and only a sacrificial gate portion is formed.

The at least one sacrificial material portion can be formed by forming a blanket layer (or layers) of a material (or various materials) and then patterning the material (or various materials) by lithography and etching. In one embodiment, the at least one sacrificial material portion can be formed by first depositing a blanket layer of a sacrificial gate dielectric material. The sacrificial gate dielectric material can be an oxide, nitride, and/or oxynitride. In one example, the sacrificial gate dielectric material can be a high k material having a dielectric constant greater than silicon dioxide. In some embodiments, a multilayered dielectric structure comprising different dielectric materials, e.g., silicon dioxide, and a high k dielectric can be formed and used as the sacrificial gate portion. The sacrificial gate dielectric material can be formed by any deposition technique including, for example, chemical vapor deposition (CVD), plasma enhanced chemical vapor deposition (PECVD), physical vapor deposition (PVD), sputtering, or atomic layer deposition.

After forming the blanket layer of sacrificial gate dielectric material, a blanket layer of a sacrificial gate material can be formed on the blanket layer of sacrificial gate dielectric material. The sacrificial gate material can include any material including, for example, polysilicon, amorphous silicon, an elemental metal (e.g., tungsten, titanium, tantalum, aluminum, nickel, ruthenium, palladium and platinum), an alloy of at least two elemental metals or multilayered combinations thereof. The sacrificial gate material can be formed utilizing a deposition process including, for example, chemical vapor deposition (CVD), plasma enhanced chemical vapor deposition (PECVD), physical vapor deposition (PVD), sputtering, or atomic layer deposition (ALD).

After forming the blanket layer of sacrificial gate material, a blanket layer of a sacrificial gate cap material can be formed. The sacrificial gate cap material may include a hard mask material such as, for example, silicon dioxide and/or silicon nitride. The sacrificial gate cap material can be formed by any suitable deposition process such as, for example, chemical vapor deposition or plasma enhanced chemical vapor deposition.

After providing the above mentioned sacrificial material stack (or any subset of said sacrificial materials), lithography and etching can be used to pattern the sacrificial material stack (or any subset of said sacrificial materials) and to provide the sacrificial gate structure 16. The remaining portion of the sacrificial gate dielectric material constitutes a sacrificial gate dielectric portion, the remaining portion of the sacrificial gate material constitutes a sacrificial gate portion, and the remaining portion of the sacrificial dielectric cap material constitutes a sacrificial dielectric cap portion.

After providing the sacrificial gate structure 16, a gate spacer 18 can be formed on exposed sidewall surfaces of the sacrificial gate structure 16; the gate spacer 18 is formed around the entire sidewalls of the sacrificial gate structure 16. The gate spacer 18 can be formed by first providing a dielectric spacer material and then etching the dielectric spacer material. Examples of dielectric spacer materials that may be employed in the present application include dielectric oxides, dielectric nitrides and/or dielectric oxynitrides. Alternatively, the dielectric spacer material that provides gate spacer 18 may be a dielectric material having a dielectric constant of less than silicon dioxide; a dielectric material having a dielectric constant of less than silicon dioxide can be referred to as a low k dielectric material. In one example, SiBCN may be used as a low k dielectric material that can provide gate spacer 18. The dielectric spacer material may be provided by a deposition process including, for example, chemical vapor deposition (CVD), plasma enhanced chemical vapor deposition (PECVD), or physical vapor deposition (PVP). The etch used to provide the gate spacer 18 may comprise a dry etching process such as, for example, reactive ion etching.

Next, physically exposed portions of each sacrificial silicon layer and each silicon germanium alloy channel material layer of the fin stack that are not protected by the sacrificial gate structure 16 and the gate spacer 18 are removed to form at least one nanosheet, ns, such as shown in FIG. 1. The removal of the physically exposed portions of each sacrificial silicon layer and each silicon germanium alloy channel material layer of the fin stack that are not protected by the sacrificial gate structure 16 and the gate spacer 18 can be performed utilizing an isotropic etching process such as, for example reactive ion etching.

Each sacrificial silicon nanosheet 12 and each silicon germanium alloy channel material nanosheet 14 within a nanosheet stack, ns, have a vertical thickness that is substantially less than its width. In one example, each sacrificial silicon nanosheet 12 and each silicon germanium alloy channel material nanosheet 14 have a vertical thickness of from 3 nm to 12 nm, and a width from 30 nm to 100 nm. At this point of the present application, each sacrificial silicon nanosheet 12 and each silicon germanium alloy channel material nanosheet 14 of a particular nanosheet stack have sidewall surfaces that are vertically aligned to each other as well as being vertically aligned to the outermost sidewall surface of the gate spacer 18.

Figure 2:
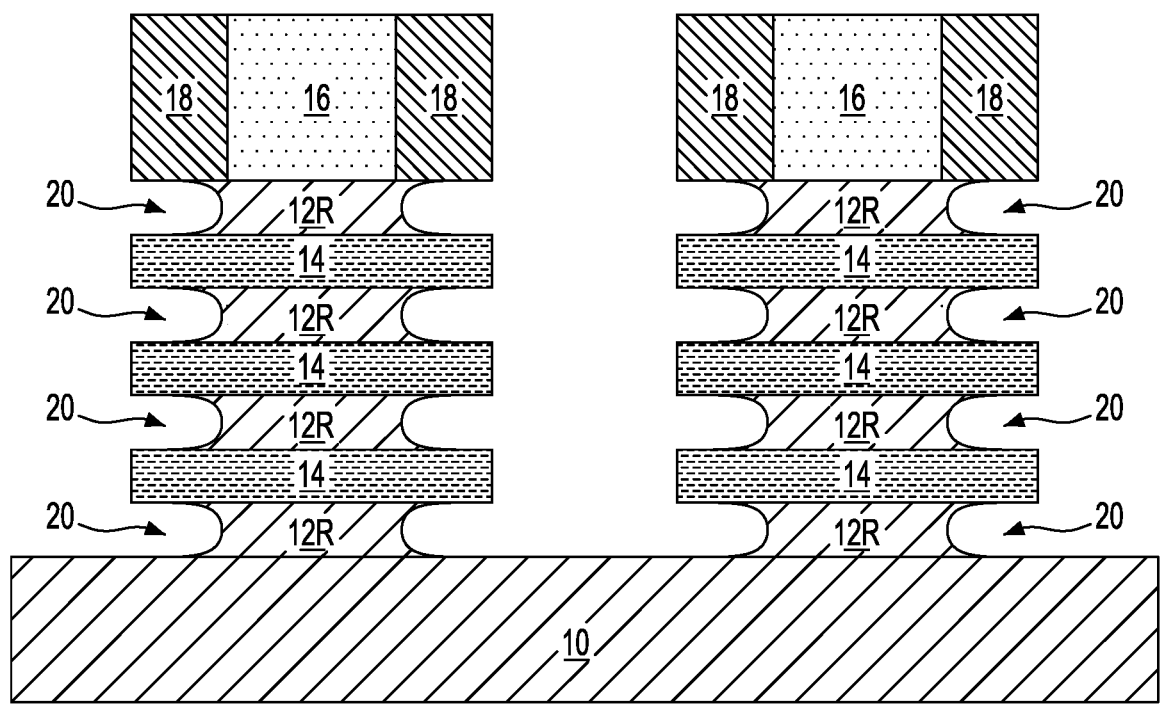
FIG. 2 is a cross sectional view of the exemplary semiconductor structure of FIG. 1 after recessing each sacrificial silicon nanosheet to provide recessed sacrificial silicon nanosheets.

Referring now to FIG. 2, there is illustrated the exemplary semiconductor structure of FIG. 1 after recessing each sacrificial silicon nanosheet 12 to provide recessed sacrificial silicon nanosheets 12R. In some embodiments, and prior to recessing each sacrificial silicon nanosheet 12, a bottom isolation structure (not shown) is formed beneath each nanosheet stack, ns. In such an embodiment, removal of the physically exposed surfaces of the semiconductor substrate 10 during the recessing of each sacrificial silicon nanosheet 12 can be avoided. In some embodiments (not shown), a physically exposed portion of the semiconductor substrate 10 may be removed during the recessing of the sacrificial silicon nanosheets 12.

The recessing of each sacrificial silicon nanosheet 12 can be performed utilizing a lateral etching process that is selective in removing end portions of each sacrificial silicon nanosheet 12 relative to each silicon germanium alloy channel material nanosheet 14. In one example, a wet etch utilizing, for example, tetramethylammonium hydroxide (TMAH) or potassium hydroxide (KOH) can be used to recess each sacrificial silicon nanosheet 12.

In some embodiments and as illustrated in FIG. 2, the recessing of each sacrificial silicon nanosheet 12 forms a concave opening 20 at the ends of each recessed sacrificial silicon nanosheet 12R. The depth of this concave opening 20 can be from 5 nm to 10 nm.

Figure 3:
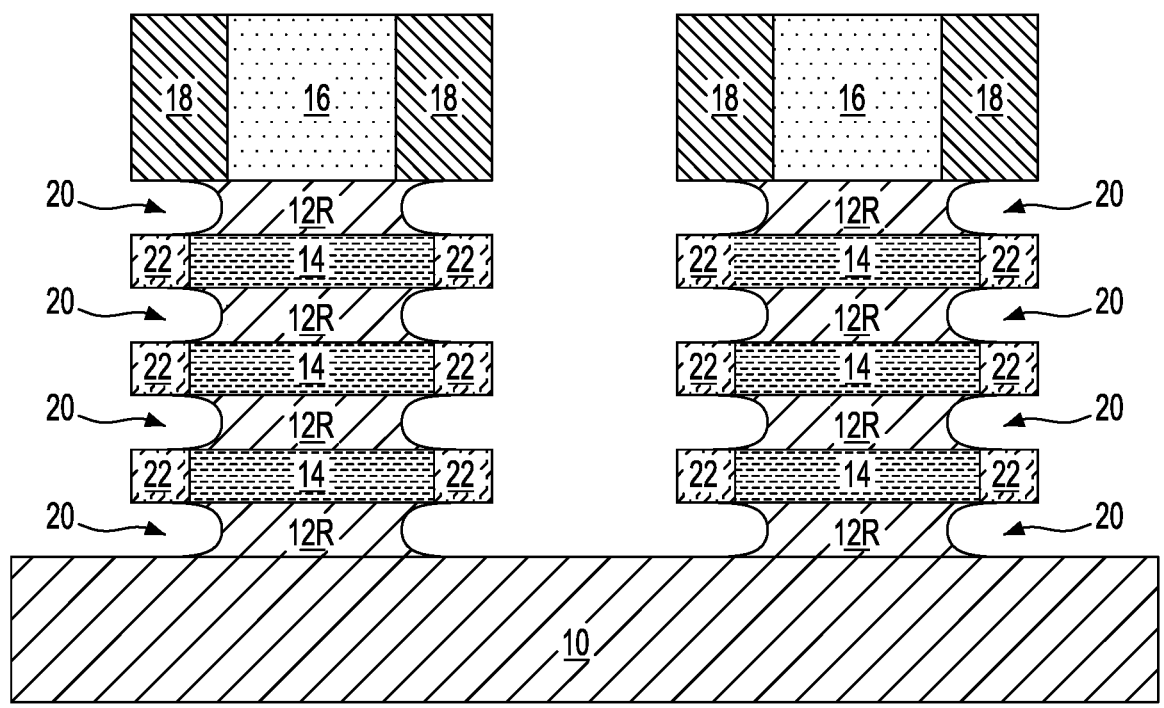
FIG. 3 is a cross sectional view of the exemplary semiconductor structure of FIG. 2 after forming source/drain (S/D) extension regions in opposing ends of each silicon germanium alloy channel material nanosheet.

Referring now to FIG. 3, there is illustrated the exemplary semiconductor structure of FIG. 2 after forming source/drain (S/D) extension regions 22 in opposing ends of each silicon germanium alloy channel material nanosheet 14. Since the source/drain (S/D) extension regions 22 are formed within the ends of each silicon germanium alloy channel material nanosheet 14, each source/drain (S/D) extension region 22 has a topmost surface that is coplanar with a topmost surface of one of the silicon germanium alloy channel material nanosheet 14, and a bottommost surface that is coplanar with a bottommost surface of the one silicon germanium alloy channel material nanosheet 14.

The source/drain (S/D) extension regions 22 can be formed by introducing an n-type or p-type dopant into the ends of each silicon germanium alloy channel material nanosheet 14. The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium.

In one embodiment, the introduction of the n-type or p-type dopant into the ends of each silicon germanium alloy channel material nanosheet 14 may be performed utilizing a plasma doping process. In another embodiment, an angle ion implantation process may be used to introduce the n-type or p-type dopant into the ends of each silicon germanium alloy channel material nanosheet 14.

Each source/drain (S/D) extension region 22 that is formed is composed of a p-type or n-type doped silicon germanium alloy. The content of germanium in each source/drain (S/D) extension region 22 is the same as the content of germanium within each silicon germanium alloy channel material nanosheet 14. The concentration of n-type dopant or p-type dopant that is present in the source/drain (S/D) extension regions 22 can range from $1\times10^{18}$ atoms/cm$^3$ to $1\times10^{21}$ atoms/cm$^3$, although dopant concentrations greater than $1\times10^{21}$ atoms/cm$^3$ or less than $1\times10^{18}$ atoms/cm$^3$ are also conceived.

Figure 4:
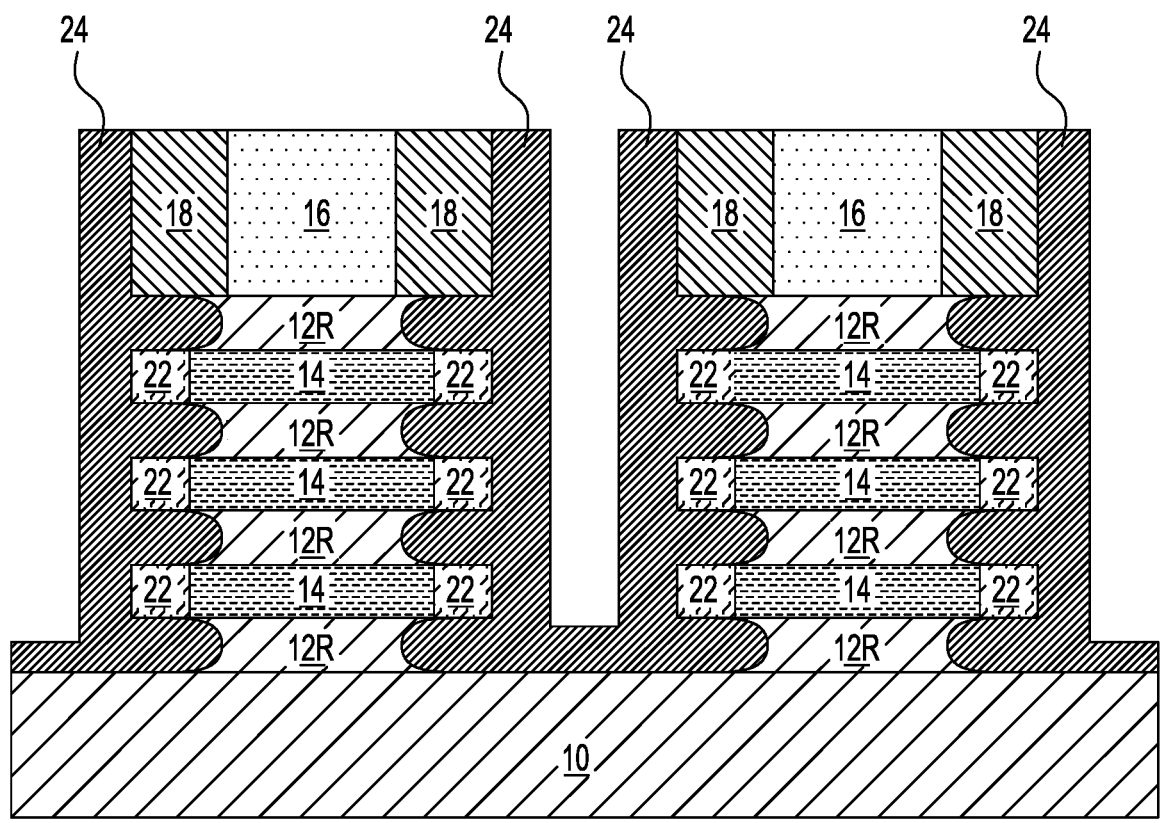
FIG. 4 is a cross sectional view of the exemplary semiconductor structure of FIG. 3 after forming a rare earth metal doped germanium dioxide layer.

Referring now to FIG. 4, there is illustrated the exemplary semiconductor structure of FIG. 3 after forming a rare earth metal doped germanium dioxide layer 24. The term "rare earth metal doped germanium dioxide" denotes germanium dioxide that contains a rare earth element as defined below, as a dopant. The rare earth metal doped germanium dioxide layer 24 that is employed in the present application has dielectric properties and thus can be used as an electrical insulator.

As is illustrated, the rare earth metal doped germanium dioxide layer 24 is formed on sidewall surfaces of the gate spacer 18, within concave opening 20 so as to contact physically exposed sidewalls of each recessed sacrificial silicon nanosheet 12R, on physically exposed surfaces of each source/drain (S/D) extension region 22 and on the physically exposed surface of semiconductor substrate 10.

The rare earth metal doped germanium dioxide layer 24 may be formed by a deposition process such as, for example, chemical vapor deposition (CVD), plasma enhanced chemical vapor deposition (PECVD) or atomic layer deposition (ALD). In some embodiments, a planarization process can be used to remove any metal doped germanium dioxide from the topmost surfaces of the gate spacers 18 and the sacrificial gate structure 16.

The term "rare earth metal" is used throughout the present application to denote at least one rare earth element such as, for example, scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) or lutetium (Lu). In one example, the rare earth metal doped germanium dioxide layer 24 is composed of yttrium doped germanium dioxide. The rare earth metal dopant that is present in the rare earth metal doped germanium dioxide layer 24 may be present in a concentration of from 10 atomic percent to 60 atomic percent.

Figure 5:
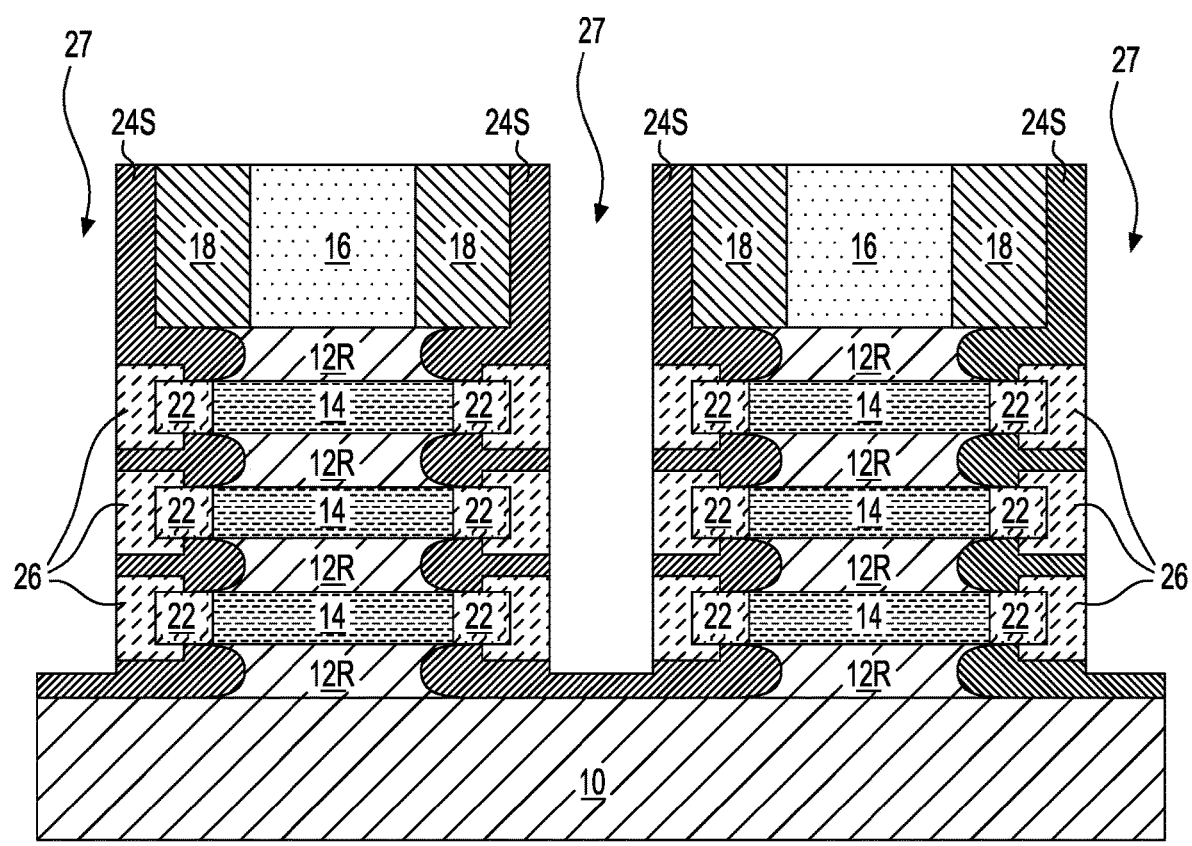
FIG. 5 is a cross sectional view of the exemplary semiconductor structure of FIG. 4 after performing an anneal to provide a rare earth metal silicide ohmic contact contacting each source/drain (S/D) extension region.

Referring now to FIG. 5, there is illustrated the exemplary semiconductor structure of FIG. 4 after performing an anneal to provide a rare earth metal silicide ohmic contact 26 contacting each source/drain (S/D) extension region 22. Due to germanium dioxide sublimation that occurs during the anneal, a rare earth metal is left on the source/drain (S/D) extension region 22, and converts the rare earth metal doped germanium dioxide layer 24 that is in direct contact with at least the sidewall surfaces of the source/drain (S/D) extension region 22 into a rare earth metal silicide ohmic contact 26. The remaining portion of the rare earth metal doped germanium dioxide layer 24 that is not converted into a rare earth metal silicide ohmic contact 26 provides a rare earth metal doped germanium dioxide spacers 24S, which are used as the inner spacer of the present application. As is shown, the rare earth metal silicide ohmic contacts 26 of a neighboring pair of nanosheet stacks are laterally spaced apart from each other by a trench 27.

The anneal may be a furnace anneal or a laser anneal. The anneal may be performed at a temperature from 400° C. to 800° C. The anneal is typically performed in an inert ambient such as, for example, nitrogen, helium, argon, neon or mixtures thereof. The duration of the anneal may vary depending on the type of anneal used. For example, longer annealing may be required when a furnace anneal is employed, composed to a laser anneal.

The rare earth metal silicide ohmic contacts 26 include a silicide of the rare earth element that provides the rare earth metal doped germanium dioxide layer 24. For example, the rare earth metal silicide ohmic contact may be yttrium silicide. In some embodiments, a rare earth silicide ohmic contact 26 contacts a sidewall surface of one of the source/drain (S/D) extension regions 22; a portion of the rare earth metal silicide ohmic contact 26 may partially extend onto a topmost surface and a bottommost surface of the source/drain (S/D) extension region 22. The metal doped germanium dioxide spacer 24S remains in the concave opening 20 and contacts a sidewall surface of a recessed sacrificial silicon nanosheet 12R. The metal doped germanium dioxide spacers 24S that remain in the concave opening 20 provide S/D isolation between each vertical stacked rare earth metal silicide ohmic contact 26 that is located on each side of a nanosheet stack.

In accordance with the present application, one of the rare earth metal silicide ohmic contacts 26 located on one of the source/drain (S/D) extension regions 22 that is positioned at a first end of one of the silicon germanium alloy channel material nanosheets 14 may serve as a source region of the nano sheet FET to be subsequently formed, while another of the rare earth metal silicide ohmic contacts 26 located on the source/drain (S/D) extension regions 22 that is positioned at a second end (opposite the first end) of one of the silicon germanium alloy channel material nanosheets 14 may serve as a drain region of the nanosheet FET.

Figure 6:
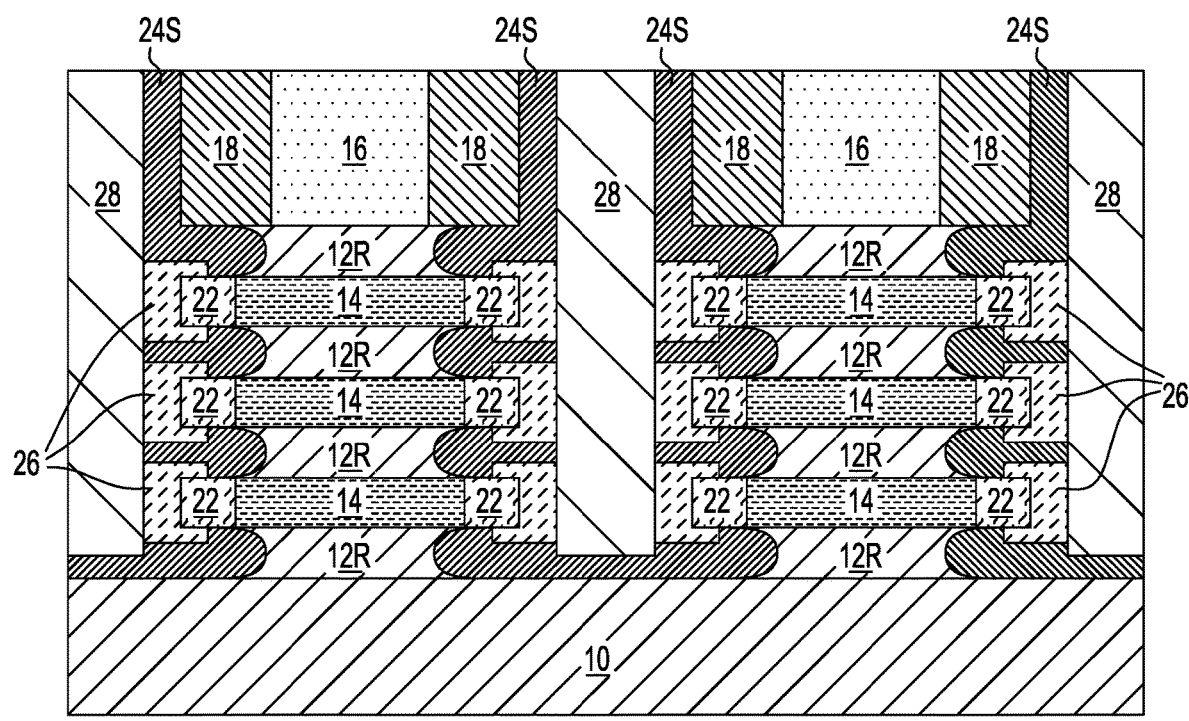
FIG. 6 is a cross sectional view of the exemplary semiconductor structure of FIG. 5 after forming a metal-containing contact structure in each trench.

Referring now to FIG. 6, there is illustrated the exemplary semiconductor structure of FIG. 5 after forming a metal-containing contact structure 28 in each trench 27. Each metal-containing contact structure 28 may include a contact metal or contact metal alloy such as, for example, copper (Cu), aluminum (Al), tungsten (W), cobalt (Co) or alloys thereof such as a cooper-aluminum alloy. The metal-containing contact structure 28 can be formed by depositing the contact metal or contact metal alloy so as to completely fill each trench 27 with a contact metal or contact metal alloy. The depositing may include chemical vapor deposition (CVD), plasma enhanced chemical vapor deposition (PECVD), sputtering, or plating. In some embodiments, a planarization process such as, for example, chemical mechanical planarization may follow the deposition of the contact metal or contact metal alloy so as to provide a metal-containing structure 28 having a topmost surface that is coplanar with topmost surfaces of the sacrificial gate structure 16 and the gate spacers 18.

Figure 7:
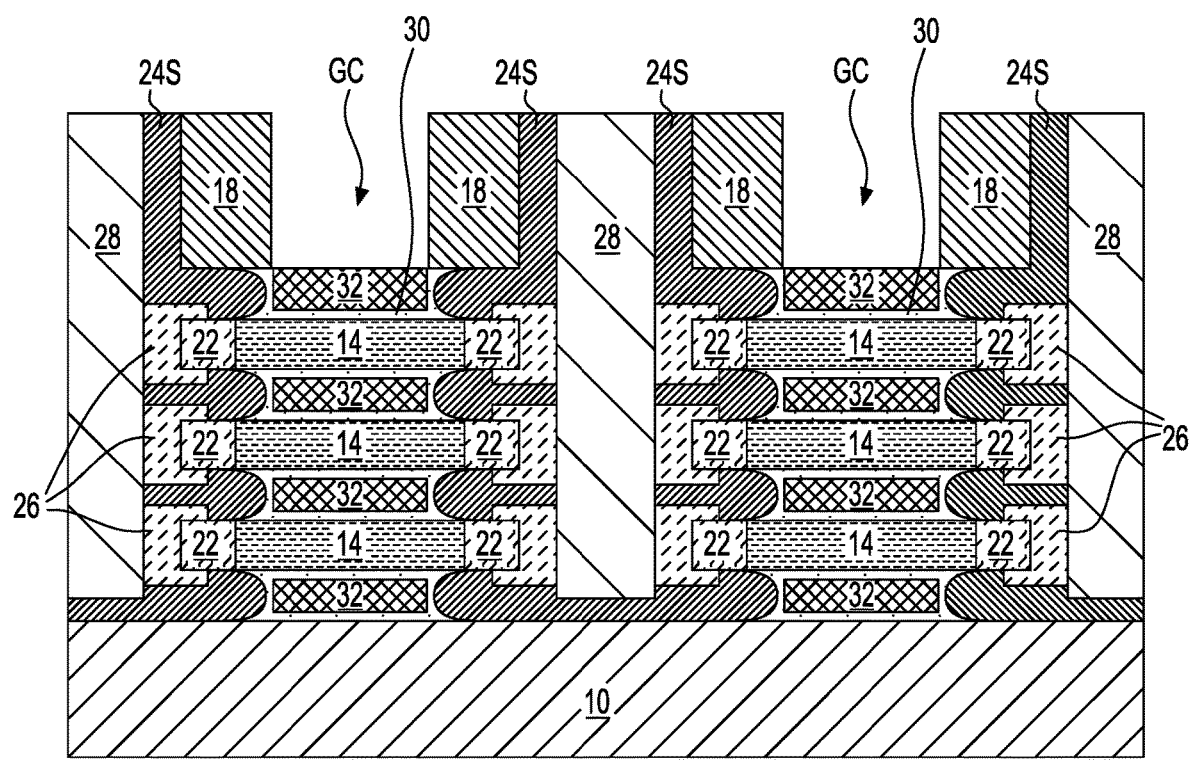
FIG. 7 is a cross sectional view of the exemplary semiconductor structure of FIG. 6 after removing the sacrificial gate structure and each recessed sacrificial silicon nanosheet, and forming a functional gate structure on exposed surfaces of each silicon germanium alloy channel material nanosheet.

Referring now to FIG. 7, there is illustrated the exemplary semiconductor structure of FIG. 6 after removing the sacrificial gate structure 16 and each recessed sacrificial silicon nanosheet 12R to provide a gate cavity, GC, and forming a functional gate structure (30, 32) on exposed surfaces of each silicon germanium alloy channel material nanosheet 14 and within each gate cavity, GC.

The replacing of the sacrificial gate structure 16 and each recessed sacrificial silicon nanosheet 12R includes first forming a middle-of-the-line (MOL) dielectric material (not shown) laterally adjacent each nanosheet stack, ns. The MOL dielectric material may be composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as MOL dielectric material. The use of a self-planarizing dielectric material as the MOL dielectric material may avoid the need to perform a subsequent planarizing step.

In one embodiment, the MOL dielectric material can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as the MOL dielectric material, a planarization process or an etch back process follows the deposition of the dielectric material that provides the MOL dielectric material.

After providing the MOL dielectric material, a gate cavity, GC, (partially shown in FIG. 7) is provided by removing the sacrificial gate structure 16 and then removing each recessed sacrificial silicon nanosheet 12R. The removal of the sacrificial gate structure 16 can be performed utilizing one or more anisotropic etching processes that are selective in removing the material (or materials) that provide the sacrificial gate structure 16.

The removal of each recessed sacrificial silicon nanosheet 12R, which suspends each silicon germanium alloy channel material nanosheet 14, may be performed by selectively etching each recessed sacrificial silicon nanosheet 12R, relative to each silicon germanium alloy channel material nanosheet 14.

Next, a functional gate structure (30, 32) is formed in the gate cavity and surrounding each of the suspended silicon germanium alloy channel material nanosheets 14. By "functional gate structure" it is meant a permanent gate structure used to control output current (i.e., flow of carriers in the channel) of a semiconducting device through electrical or magnetic fields. The functional gate structure may include a gate dielectric portion 30 and a gate conductor portion 32. The gate dielectric portion 30 is located on physically exposed surfaces of the silicon germanium alloy channel material nanosheets 14, while the gate conductor portion 32 is located on and between each gate dielectric portion 30.

The gate dielectric portion 30 may include a gate dielectric material. The gate dielectric material that provides the gate dielectric portion 30 can be an oxide, nitride, and/or oxynitride. In one example, the gate dielectric material that provides the gate dielectric portion 30 can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as the gate dielectric portion 30.

The gate dielectric material used in providing the gate dielectric portion 30 can be formed by any deposition process including, for example, chemical vapor deposition (CVD), plasma enhanced chemical vapor deposition (PECVD), physical vapor deposition (PVD), sputtering, or atomic layer deposition. In one embodiment of the present application, the gate dielectric material used in providing the gate dielectric portion 30 can have a thickness in a range from 1 nm to 10 nm. Other thicknesses that are lesser than, or greater than, the aforementioned thickness range can also be employed for the gate dielectric material that may provide the gate dielectric portion 30.

The gate conductor portion 32 can include a gate conductor material. The gate conductor material used in providing the gate conductor portion 32 can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In one embodiment, the gate conductor portion 32 may comprise an nFET gate metal. In another embodiment, the gate conductor portion 32 may comprise a pFET gate metal. In the embodiment illustrated, the gate dielectric portion 32 on the left hand side may be a component of a first conductivity type nanosheet device, while the gate dielectric portion of the right hand side may be a component of a second conductive type nanosheet device, wherein the first conductive type differs from the second conductivity type.

The gate conductor material used in providing the gate conductor portion 32 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. In one embodiment, the gate conductor material used in providing the gate conductor portion 32 can have a thickness from 50 nm to 200 nm. Other thicknesses that are lesser than, or greater than, the aforementioned thickness range can also be employed for the gate conductor material used in providing the gate conductor portion 32.

Figure 8:
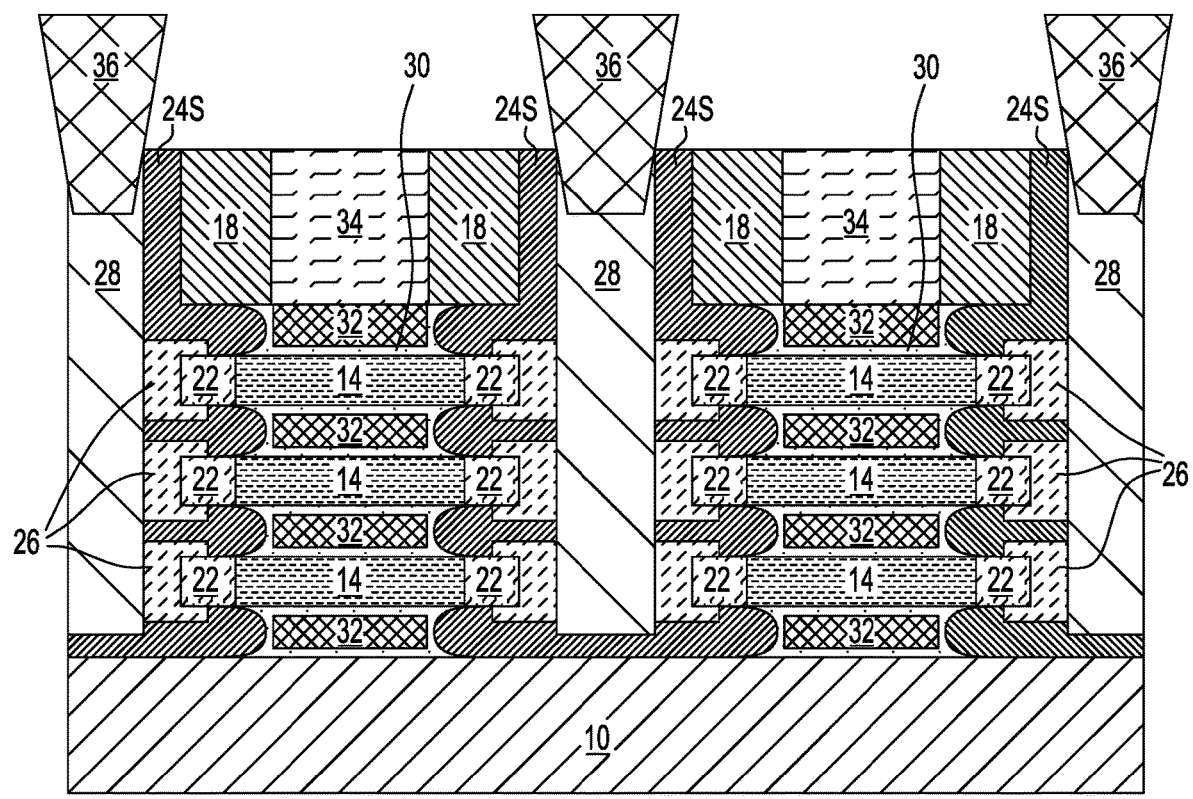
FIG. 8 is a cross sectional view of the exemplary semiconductor structure of FIG. 7 after forming a gate cap and formation of contact structures.

Referring now to FIG. 8, there is illustrated he exemplary semiconductor structure of FIG. 7 after forming a gate cap 34 and formation of contact structures 36. The gate cap 34 may include any hard mask material such as, for example, silicon dioxide or silicon nitride. The gate cap may be formed by a deposition process, followed by a planarization process. The contact structures 36 may be formed by depositing another contact metal or contact metal alloy that may the same or different from the contact metal or contact metal alloy that provides each metal-containing contact structure 28. The contact structures 36 can be formed by deposition. In some embodiments (not shown), a gate contact structure is formed into the gate cap 34 and contacting a topmost surface of the gate conductor portion 32.

FIGS. 7-8 illustrate an exemplary semiconductor structure of the present application that includes a plurality of vertically stacked and spaced apart silicon germanium alloy channel material nanosheets 14 suspended above a semiconductor substrate 10. A source/drain extension region 22 is located at opposing ends of each silicon germanium alloy channel material nanosheet 14. Each source/drain extension region 22 includes an n-doped or p-doped silicon germanium alloy. A functional gate structure (30, 32) surrounds a portion of each silicon germanium alloy channel material nanosheet 14 of the plurality of vertically stacked and spaced apart silicon germanium alloy channel material nanosheets 14. A rare earth metal silicide ohmic contact 26 is located on at least a sidewall surface of each of the source/drain extension regions 22. An inner spacer 24S is located between each of the silicon germanium alloy channel material nanosheets 14 and physically contacting sidewalls of the functional gate structure (30, 32), wherein the inner spacer 24S comprises a rare earth metal doped germanium dioxide.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:
    forming at least one nanosheet stack located on a surface of a semiconductor substrate, wherein the at least one nanosheet stack contains alternating nanosheets of a sacrificial silicon nanosheet and a silicon germanium alloy channel material nanosheet, wherein a sacrificial gate structure and a gate spacer are present straddling over a portion of the least one nanosheet stack;
    recessing each sacrificial silicon nanosheet to provide recessed silicon sacrificial nanosheets;
    forming source/drain (S/D) extension regions in the ends of each silicon germanium alloy channel material nanosheet;
    forming a rare earth metal doped germanium dioxide layer on physically exposed surfaces of each recessed sacrificial silicon nanosheet and each source/drain (S/D) extension region;
    performing an anneal to convert the rare earth metal doped germanium dioxide layer that is in physical contact with a sidewall of each source/drain (S/D) extension region into a source/drain (S/D) region that is composed entirely of a rare earth metal silicide ohmic contact, while the rare earth metal doped germanium dioxide layer that is not converted by the anneal forms an inner spacer wherein each S/D region is vertically separated in an entirety from one another by the inner spacer;

forming a metal-containing contact structure laterally adjacent the at least one nanosheet stack and in contact with outermost sidewall surfaces of both the inner spacer and the rare earth metal silicide ohmic contact;

removing the sacrificial gate structure and each recessed sacrificial Si nanosheet to suspend each silicon germanium alloy channel material nanosheet; and forming a functional gate structure surrounding each suspended silicon germanium alloy channel material nanosheet.

2. The method of claim 1, wherein the recessing comprises a lateral wet etching process.

3. The method of claim 1, wherein the rare earth metal doped germanium dioxide layer comprises from 10 atomic percent to 60 atomic percent of a rare earth metal.

4. The method of claim 1, wherein the rare earth metal doped germanium dioxide is yttrium doped germanium dioxide.

5. The method of claim 1, wherein the forming the source/drain (S/D) extension regions comprises introducing an n-type or p-type dopant into the ends of each silicon germanium alloy channel material nanosheet.

6. The method of claim 5, wherein the introducing the n-type dopant or p-type dopant comprises plasma doping.

7. The method of claim 5, wherein the introducing of the n-type dopant or p-type dopant comprises an angle ion implantation process.

8. The method of claim 1, wherein the annealing is performed at a temperature from 400° C. to 800° C. and in an inert ambient.

9. The method of claim 1, wherein after forming the functional gate structure a gate cap is formed on a topmost surface of the functional gate structure and between the gate spacer.

10. The method of claim 1, further comprising forming a contact structure contacting a surface of the metal-containing contact structure.

11. The method of claim 1, wherein the forming the metal-containing contact structure comprises depositing a contact metal or contact metal alloy and performing a planarization process.

12. The method of claim 1, wherein the forming of the at least one nanosheet stack comprises:

forming at least one fin stack composed of alternating layer of sacrificial silicon and silicon germanium alloy channel material on the substrate;

forming the sacrificial gate structure on a portion of the fin stack;

forming the gate spacer laterally adjacent to the fin structure and on another portion of the fin structure; and;

removing physically exposed portions of the fin structure not covered by the sacrificial gate structure and the gate spacer.

13. The method of claim 12, wherein the forming of the fin structure comprises:

epitaxial growing a semiconductor material stack containing the alternating layers of the sacrificial silicon and silicon germanium alloy channel material; and patterning the semiconductor material stack.

14. The method of claim 1, wherein the forming of the rare earth metal germanium dioxide comprises a deposition process.

15. The method of claim 1, wherein each recessed sacrificial silicon nanosheet has a concave sidewall.

16. The method of claim 1, wherein the rare earth metal silicide ohmic contact is formed on a sidewall and a topmost of the S/D extension region.

17. The method of claim 1, wherein the inner spacer has an innermost sidewall surface that contacts a sidewall of the functional gate structure, and the outermost sidewall surface, which is opposite the innermost sidewall surface, that is vertically aligned to the outermost sidewall surface of the rare earth metal silicide ohmic contact.

18. A method of forming a semiconductor structure, the method comprising:

forming at least one nanosheet stack located on a surface of a semiconductor substrate, wherein the at least one nanosheet stack contains alternating nanosheets of a sacrificial silicon nanosheet and a silicon germanium alloy channel material nanosheet, wherein a sacrificial gate structure and a gate spacer are present straddling over a portion of the least one nanosheet stack;

recessing each sacrificial silicon nanosheet to provide recessed silicon sacrificial nanosheets;

forming source/drain (S/D) extension regions in the ends of each silicon germanium alloy channel material nanosheet;

forming a rare earth metal doped germanium dioxide layer on physically exposed surfaces of each recessed sacrificial silicon nanosheet and each source/drain (S/D) extension region;

performing an anneal to convert the rare earth metal doped germanium dioxide layer that is in physical contact with a sidewall of each source/drain (S/D) extension region into a source/drain (S/D) region that is composed entirely of a rare earth metal silicide ohmic contact, while the rare earth metal doped germanium dioxide layer that is not converted by the anneal forms an inner spacer, wherein a portion of the rare earth metal silicide ohmic contact extends onto a topmost surface and a bottommost surface of each S/D extension region;

forming a metal-containing contact structure laterally adjacent the at least one nanosheet stack and in contact with outermost sidewall surfaces of both the inner spacer and the rare earth metal silicide ohmic contact;

removing the sacrificial gate structure and each recessed sacrificial Si nanosheet to suspend each silicon germanium alloy channel material nanosheet; and forming a functional gate structure surrounding each suspended silicon germanium alloy channel material nanosheet.

* * * * *